(12) United States Patent
Anselm

(10) Patent No.: US 7,542,503 B2
(45) Date of Patent: Jun. 2, 2009

(54) DISTRIBUTED FEEDBACK LASER WITH IMPROVED OPTICAL FIELD UNIFORMITY AND MODE STABILITY

(75) Inventor: Klaus Alexander Anselm, Sugar Land, TX (US)

(73) Assignee: Applied Optoelectronics, Inc., Sugar Land, TX (US)

(*) Notice: Subject to any disclaimer, the term of this patent is extended or adjusted under 35 U.S.C. 154(b) by 0 days.

(21) Appl. No.: 11/869,619

(22) Filed: Oct. 9, 2007

(65) Prior Publication Data

US 2008/0112445 A1 May 15, 2008

Related U.S. Application Data

(60) Provisional application No. 60/828,568, filed on Oct. 6, 2006.

(51) Int. Cl.
*H01S 3/10* (2006.01)
*H01S 3/08* (2006.01)

(52) U.S. Cl. .......................................... 372/96; 372/26
(58) Field of Classification Search ............. 372/26.96, 372/26, 96
See application file for complete search history.

(56) References Cited

U.S. PATENT DOCUMENTS

| | | | | | |
|---|---|---|---|---|---|
| 4,257,011 | A | * | 3/1981 | Nakamura et al. | 372/46.012 |
| 5,111,475 | A | * | 5/1992 | Ackerman et al. | 372/96 |
| 5,802,096 | A | * | 9/1998 | Okuda | 372/102 |
| 6,608,855 | B1 | | 8/2003 | Hwang et al. | |
| 7,180,930 | B2 | | 2/2007 | Takaki et al. | |

OTHER PUBLICATIONS

G. Morthier, K. David, P. Vankwikelberge and R. Baets, "A New DFB-Laser Diode with Reduced Spatial Hole Burning", IEEE Photonics Technology Letters, vol. 2, No. 6, Jun. 1990, pp. 388-390.
Geert Morthier and Roel Baets, "Design of Index-Coupled DFB Lasers with Reduced Longitudinal Spatial Hole Burning", Journal of Lightwave Technology, vol. 9, No. 10, Oct. 1991, pp. 1305-1313.
Sang-Bae Kim and Jong-Sup Cho, "Sampled Grating Conventional DFB Lasers with Fabricability and High Immunity to the Spatial-Hole Burning", IEEE Photonics Technology Letters, vol. 9, No. 5, May 1997, pp. 560-562.
Masashi Usami and Shigeyuki Akiba, "Suppression of Longitudinal Spatial Hole-Burning Effect in /4-Shifted DFB Lasers by Nonuniform Current Distribution", IEEE Journal of Quantum Electronics, vol. 25, No. 6, Jun. 1989, pp. 1245-1253.
Leonard J. P. Ketelsen, Isako Hoshino and David A. Ackerman, "The Role of Axially Nonuniform Carrier Density in Altering the TE-TE Gain Margin in InGaAsP-InP DFB Lasers", IEEE Journal Of Quantum Electronics, vol. 27, No. 4, Apr. 1991, pp. 957-964.

* cited by examiner

*Primary Examiner*—Armando Rodriguez
(74) *Attorney, Agent, or Firm*—Norman Stephen Kinsella; Grossman, Tucker, Perrault & Pfleger LLC

(57) ABSTRACT

A directly modulated distributed feedback (DFB) laser with improved optical field uniformity and mode stability may include a laser cavity and a distributed reflector and/or external reflectors. The distributed reflector may be a Bragg grating and may extend asymmetrically over a only portion of the laser cavity. The external reflectors may themselves be distributed Bragg reflectors and may have unequal reflectances. Optical field uniformity may be improved by adjusting the length and/or position of the distributed reflector in the laser cavity. Optical field uniformity may be improved by adjusting a coupling strength parameter, which is a function of a coupling coefficient, $\kappa$, and the length of the distributed reflector.

18 Claims, 4 Drawing Sheets

DISTRIBUTED FEEDBACK LASER WITH IMPROVED OPTICAL FIELD UNIFORMITY AND MODE STABILITY

CROSS-REFERENCE TO RELATED APPLICATIONS

This application claims the benefit of co-pending U.S. Provisional Patent Application Ser. No. 60/828,568, filed on Oct. 6, 2006, which is fully incorporated herein by reference.

TECHNICAL FIELD

The present invention relates to distributed feedback (DFB) lasers and, in particular, to DFB lasers with improved optical mode distribution.

BACKGROUND INFORMATION

The following descriptions and examples are not admitted to be prior art by virtue of their inclusion within this section.

There are several types of lasers, including gas lasers, solid-state lasers, liquid (dye) lasers, free electron, and semiconductor lasers. All lasers have a laser cavity defined by an optical gain medium in the laser cavity and a method for providing optical feedback. The gain medium amplifies electromagnetic waves (light) in the cavity by stimulated emission, thereby providing optical gain.

In semiconductor lasers, a semiconductor active region serves as the gain medium. Semiconductor lasers may be diode (bipolar) lasers or non-diode, unipolar lasers such as quantum cascade (QC) lasers. Semiconductor lasers are used for a variety of industrial and scientific applications and can be built with a variety of structures and semiconductor materials.

The use of semiconductor lasers for forming a source of optical energy is attractive for a number of reasons. Semiconductor lasers have a relatively small volume and consume a small amount of power as compared to conventional laser devices. Further, semiconductor lasers can be fabricated as monolithic devices, which do not require a combination of a resonant cavity with external mirrors and other structures to generate a coherent output laser beam. For monolithic designs, the optical feedback is typically provided by a reflector or reflectors external and/or adjacent to the optical gain medium or some combination of feedback mechanisms. For example, in Fabry-Perot or Vertical-Cavity Surface-Emitting Laser (VCSEL) lasers a set of mirrors or cleaved facets that bound the optical gain medium may provide the optical feedback. In distributed feedback (DFB) lasers, a distributed reflector along the gain medium may provide the feedback. The distributed reflector may be a Bragg reflector (i.e., Bragg grating). A distributed Bragg reflector (grating) may also be used as an external reflector. In this case, a Bragg grating or gratings may be at or near the ends of the gain medium. A laser with a distributed Bragg reflector as an external reflector is known as a Distributed Bragg Reflector (DBR) laser. In some embodiments, a DFB laser may have external reflectors in addition to a distributed reflector.

A semiconductor laser with simple broad wavelength external reflectors will generally operate at several wavelengths, or optical modes. For some applications such as optical fiber communication or chemical sensing, operation at a single optical mode is strongly preferred. In order to achieve single mode operation with external reflectors, those external reflectors must provide very wavelength-selective feedback, which adds significantly to the complexity and cost.

A distributed reflector is often used as a convenient and relatively inexpensive method for making a laser operate with a single optical mode. In its simplest configuration, with a uniform distributed reflector and no external reflectors, two laser modes are supported. There are two common approaches for achieving single mode operation. One approach is to use one or more external reflectors in addition to the distributed reflector and the other is to put one or more phase shifts within the distributed reflector. The use of external reflectors can allow much more light to be emitted from one of the two ends (facets) of the laser, which can be beneficial for example in coupling light into an optical fiber with greater efficiency. An external reflector is inherently formed at the interface between the semiconductor and air. Increasing or decreasing the reflectance is typically achieved by applying optical coatings on the laser ends.

One disadvantage of using external reflectors in conjunction with a distributed reflector is that the phase shift (i.e., the distance) between the external reflector and the distributed reflector affects the operating characteristics of the laser. Some of the changes in the laser characteristics are undesirable (e.g., insufficient suppression of the second laser mode). For a typical semiconductor DFB laser, a distance on the order of nanometers can result in a significant change in the phase. Generally, this distance cannot be completely controlled. Compensating for this phase can be achieved with a tuning mechanism such as multiple-section current injection which adds significantly to the cost and the complexity and the device. Another common approach is to discard the lasers with the undesirable operating characteristics. This approach will add to the cost depending on the range of acceptable operating characteristics for the intended application.

The use of phase shifts in the distributed reflector can allow for single mode operation with less variability in the laser operating characteristics. Because this approach is used with antireflection coatings, the power emits more equally from both laser facets, leading to a lower usable power and efficiency. In addition the optical intensity within the laser cavity can vary strongly. This non-uniformity in the optical intensity can result in mechanisms such as localized gain saturation, spatial hole burning, and localized heating which degrade the laser performance.

Several approaches have been proposed to improve the optical non-uniformity. Multiple phase shifts and distributed phase shifts improve the uniformity of the optical intensity. One example of a single mode DFB laser having an improved phase-shift section is disclosed in U.S. Pat. No. 6,608,855, which is herein incorporated by reference. Varying the pitch or the coupling strength of the grating or using multi-section current injection have been proposed as ways to improve phase-shifted DFB lasers, but are more complex if not impractical to implement. In addition, gratings with modulated coupling strength have a degraded side mode suppression ratio (SMSR), which is a measure of the suppression of the second strongest lasing mode. All of these approaches use no external reflector and still suffer from reduced efficiency due to backside losses. Another approach which has been proposed for improving the uniformity of DFB lasers with external reflectors is a sampled grating. While this approach should be simple to fabricate, the improvement in the optical field uniformity is insufficient.

DFB lasers may include both continuous wave (CW) and directly modulated (DM) semiconductor lasers. A CW DFB laser may include a light generating portion (e.g., cavity) and a modulation portion. A continuous, approximately constant, input current, at or near lasing threshold, may be supplied to the light generating portion. A modulation current may be supplied to the modulation portion. Accordingly, a CW DFB laser may generate a continuous light output in the light generating portion, which is then modulated by the modulation current in the modulation portion.

A DM DFB laser may generate and modulate light in the same portion (e.g., cavity). An input current may be supplied that has two components. The first component may be a threshold current sufficient for lasing. The second component may include a bias current and a modulation current. Rather than a continuous light output that is then modulated, the input current that drives the laser is itself modulated. For example, laser drive circuitry may include one or more current sources that are configured to provide threshold current sufficient for lasing, bias current for establishing an operating point above the threshold and a modulation current. Accordingly, the input current to the laser is modulated resulting in modulated light output.

A DM DFB laser may be more susceptible than a CW DFB to nonlinearities (e.g., optical non-uniformities) that may affect the light output power versus input current relationship of the laser cavity (e.g., slope efficiency). In the case of the CW DFB laser, the input current to the laser cavity may be approximately constant (i.e., the laser light output is modulated external to the laser cavity). Accordingly, the cavity's nonlinearities may not significantly affect the light output power. The DM DFB laser is sensitive to these nonlinearities because the input current includes the modulation current. It may therefore be desirable to reduce such nonlinearities for DM DFB lasers.

BRIEF DESCRIPTION OF THE DRAWINGS

These and other features and advantages will be better understood by reading the following detailed description, taken together with the drawings wherein.

DETAILED DESCRIPTION

Generally, this disclosure describes a distributed feedback (DFB) laser with improved optical field uniformity and mode stability. This disclosure further describes a directly modulated DFB laser having a laser cavity that may include a distributed reflector and/or external reflectors. The distributed reflector may be a Bragg grating and may extend asymmetrically over a portion of an active region of the laser cavity. The external reflectors may themselves be distributed Bragg reflectors and may have unequal reflectances. Optical field uniformity may be improved by adjusting the length and/or position of the distributed reflector in the laser cavity. Optical field uniformity may also be improved by adjusting a coupling strength parameter that is a function of a coupling coefficient, κ, and the length of the distributed reflector.

Figure 1A:
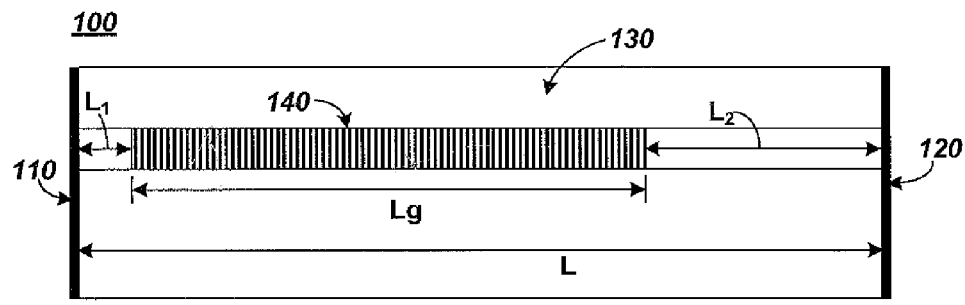
FIGS. 1A through 1C depict three illustrative embodiments of DFB lasers with external reflectors.

FIG. 1A depicts a simplified diagram of a DFB laser 100 consistent with an embodiment of the present disclosure. The DFB laser 100 has an active region 130 that has length L. The DFB laser active region 130 is bounded on opposing ends by a first facet 110 and a second facet 120. The DFB laser 100 may further include a distributed reflector 140 adjacent to the active region 130. The distributed reflector 140 may have a length Lg. In an embodiment, the distributed reflector 140 may be a Bragg grating. A first end of the distributed reflector 140 may be a distance $L_1$ from the first facet 110. A second end of the distributed reflector 140 may be a distance $L_2$ from the second facet 120. Although shown below the active region 130 in FIG. 1A, the distributed reflector 140 may be positioned above or below the active region 130.

In an embodiment, the first facet 110 may be an antireflection (AR) facet. In an embodiment, the first facet 110 may be coated with a relatively low reflectance coating. "Low reflectance" may be understood to mean reflectivity less than about 5%. In an embodiment, the second facet 120 may be a high reflection facet (HR). In an embodiment, the second facet may be coated with a relatively high reflectance coating. "High reflectance" may be understood to mean reflectivity between about 25% and about 99%. As used herein, one skilled in the art should understand "about" to mean within acceptable tolerances.

Figure 1B:
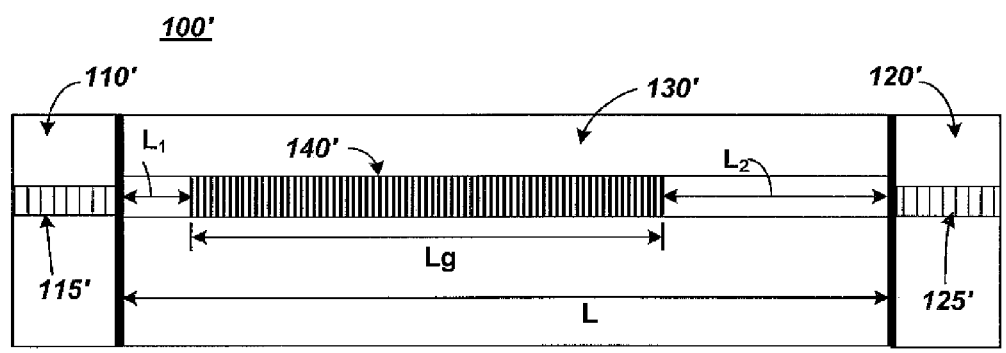

FIG. 1B depicts a simplified diagram of a DFB laser 100' consistent with another embodiment of the present disclosure. The DFB laser 100' has active region 130' of the length L and is bounded on opposing ends by a first region 110' and a second region 120'. The DFB laser 100' may include a distributed reflector 140' having a length Lg. The distributed reflector 140' may be a Bragg grating. A first end of the distributed reflector 140' may be a distance $L_1$ from the first region 110'. A second end of the distributed reflector 140' may be a distance $L_2$ from the second region 120'. The distributed reflector 140' may be positioned above or below the active region 130'. In an embodiment, the first region 110' may include an external reflector 115' (e.g., a distributed Bragg reflector) having a relatively low reflectance. In another embodiment, the second region 120' may include an external reflector 125' (e.g., a distributed Bragg reflector) having a relatively high reflectance.

Figure 1C:
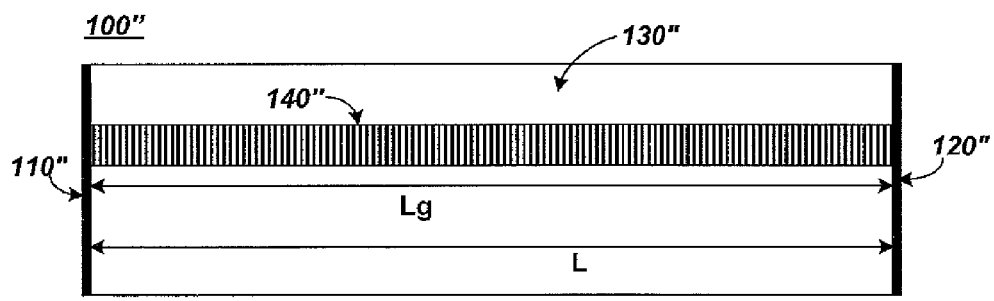

FIG. 1C depicts a simplified example of a DFB laser 100" with a distributed reflector 140" that extends the length, L, of the active region 130 of laser 100" (i.e., Lg=L). Similar to FIG. 1A, the active region 130" of DFB laser 100" is bounded on opposing ends by a first facet 110" and the second facet 120". The embodiment depicted in FIG. 1C ("full distributed reflector") is provided for comparison purposes, as will be discussed below.

Figure 2A:
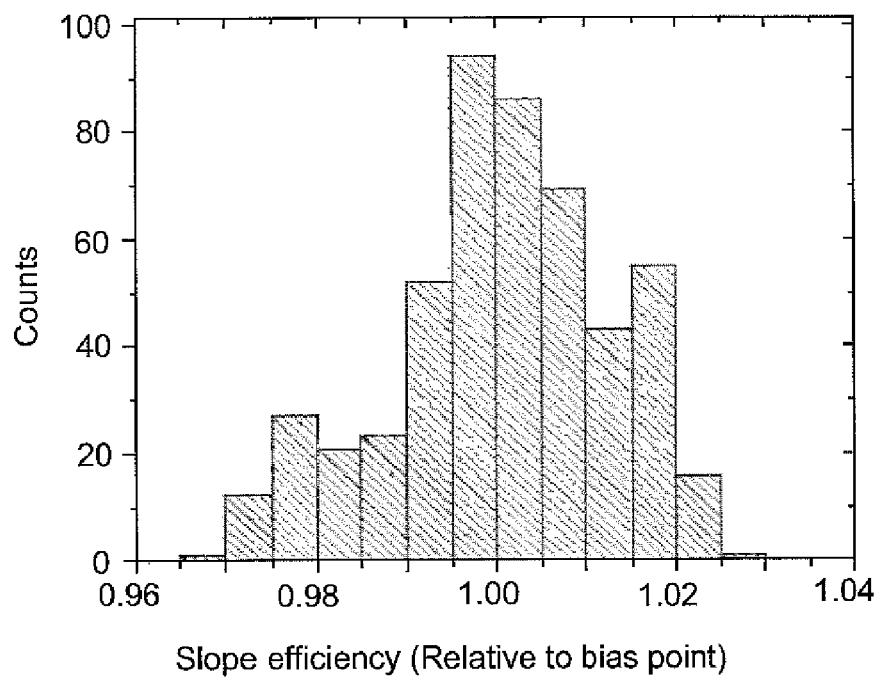
FIGS. 2A and 2B are two histogram plots illustrating the variation, over a range of phase shifts, of the slope efficiency relative to the bias point, for a full grating and a partial grating, respectively.
Figure 2B:
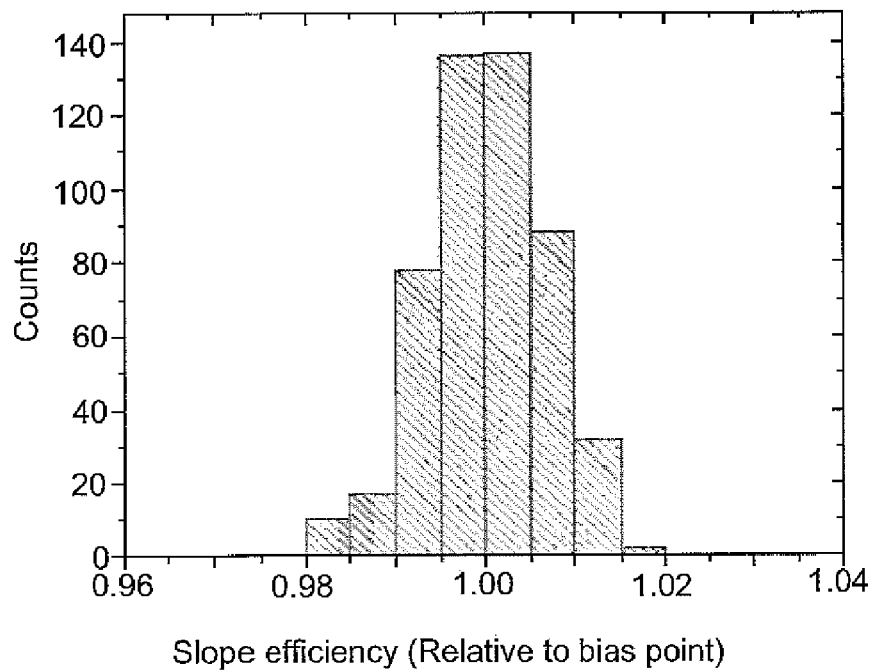

FIGS. 2A and 2B are histograms of simulation results for comparing the relative linearity (e.g., optical field uniformity) of a DFB laser with a full distributed reflector and external reflectors (e.g., 100", FIG. 1C) and a DFB laser with a partial distributed reflector with external reflectors (e.g., 100', FIG. 1B), respectively. For the simulation results shown in FIGS. 2A and 2B, the active region length, L, is 250 μm. FIG. 2A shows results for a full reflector as illustrated, for example, in FIG. 1C, with Lg=L=250 μm. FIG. 2B shows results for a partial reflector with Lg=70% of L. In other words, FIG. 2B may correspond to the embodiment illustrated in FIG. 1A or 1B with $L_1$=0, $L_2$=75 μm, Lg=175 μm, and L=250 μm.

The histograms in FIGS. 2A and 2B illustrate distributions of slope efficiency relative to a slope at a bias point. Slope efficiency may generally be understood to mean a change in light output power divided by a corresponding change in input current (above a threshold current). In other words, the slope efficiency may be understood to mean the slope of the light output power versus input current characteristic curve at currents greater than the threshold current for lasing. For the simulation results shown, a small signal modulation current was used. "Small signal" as used herein means peak current amplitude of less than or equal to ten percent of the bias or mean operating current (above the threshold current). This disclosure is not limited to small signal modulation currents. A small signal modulation current was chosen merely as an illustrative example for the simulations.

In addition to varying the input current with a small signal modulation current, a phase shift parameter was also varied in the simulations. As noted above, a disadvantage of using external reflectors with a distributed reflector is that variation in the distance between the external reflector and the distributed reflector on the order of nanometers may result in a significant phase shift. The phase shift may detrimentally affect the operating characteristics of the laser and generally the distance cannot be completely controlled. Accordingly, the histograms include results for about 500 phase shifts in the range of about 0 to about 360 degrees. The phase shift parameter (i.e., distance) was included between a relatively high reflectance external reflector (e.g., 120', FIG. 1B and 120", FIG. 1C) and a second end of a distributed reflector (e.g., 140', FIG. 1B and 140", FIG. 1C).

In the histograms, the slope efficiencies (i.e., $\Delta$ light output power/$\Delta$ modulation current) over the range of the phase shift parameter are relative to the slope efficiency at the bias point. For a linear system, a histogram of the variation of these relative slope efficiencies would be narrow, centered at one, meaning relatively little variation. In other words, over the range of the phase shift parameter and for a small signal modulation current around a bias point (i.e., no clipping), the proportion of light output power to modulation current would be approximately constant. Conversely, a histogram for a nonlinear system and/or a system subject to distortion would be broad (i.e., relatively larger standard deviation) with the "width" of the histogram indicative of the amount of nonlinearity. In other words, the light output power would not be proportional to the modulation current and therefore, the slope efficiency would vary.

The histogram in FIG. 2A (corresponding to the full distributed reflector of FIG. 1C) illustrates a relatively nonlinear system when compared to the histogram shown in FIG. 2B (corresponding to a partial (70%) distributed reflector, e.g., FIG. 1B). Thus, a DFB laser 100, 100' including a partial distributed reflector 140, 140' (FIGS. 1A and 1B) may reduce the nonlinearities within the laser cavity as compared to a DFB laser 100" with a full distributed reflector (FIG. 1C).

Figure 3:
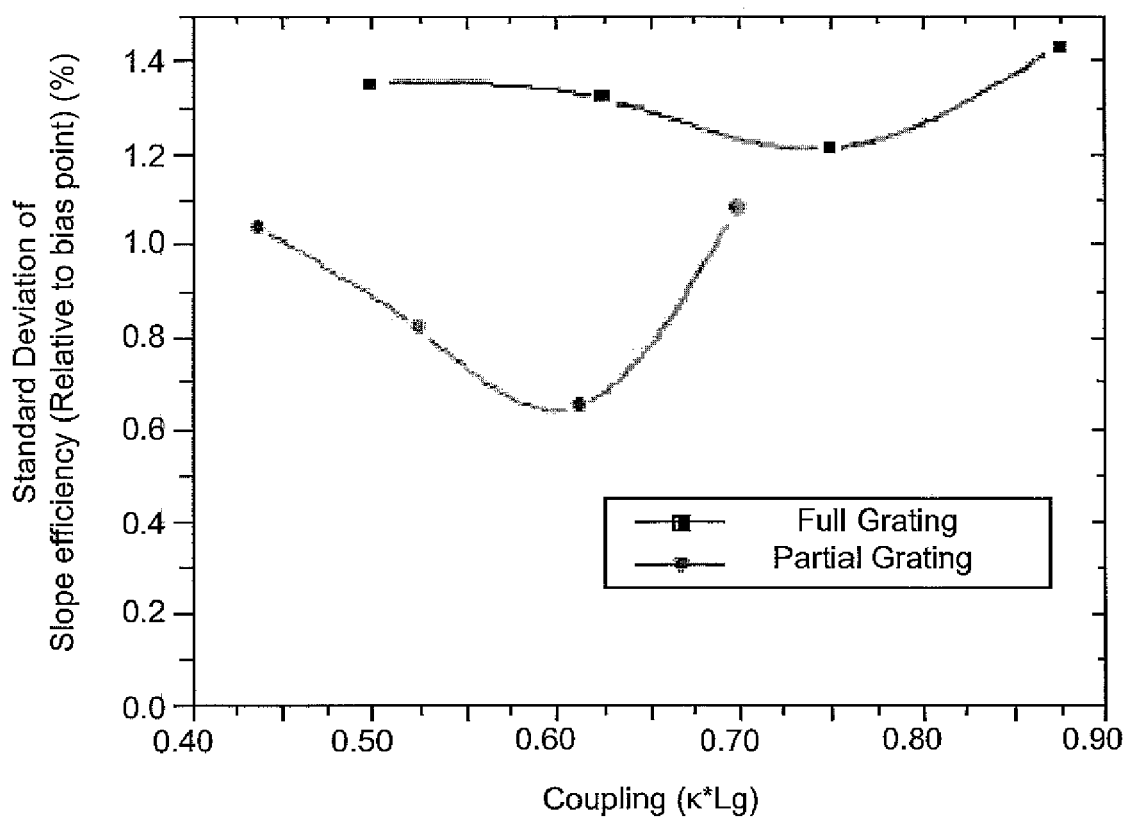
FIG. 3 includes plots of the standard deviation of the variation, over a range of phase shifts, of the slope efficiency relative to the bias point, for a full grating and a partial grating as a function of coupling strength.

The degree of laser nonlinearity may be further illustrated using the standard deviations of the histograms of the variations in the slope efficiencies relative to the bias point. FIG. 3 includes plots of the standard deviations of histograms of the results for the two example lasers discussed above: active region length L=250 µm, full distributed reflector (e.g., 100", FIG. 1C) and partial reflector (e.g., 100', FIG. 1B, with e.g., Lg=175 µm and $L_1$=0). FIG. 3 includes an additional variable, a coupling coefficient $\kappa$. The coupling coefficient $\kappa$ has units cm$^{-1}$. The coupling coefficient, $\kappa$, multiplied by the grating length, Lg, yields a coupling strength, $\kappa*Lg$, a unitless term. (The histograms depicted in FIGS. 2A and 2B correspond to the minimum standard deviations of FIG. 3, i.e., about $\kappa*Lg$=0.60 for the partial distributed reflector and about $\kappa*Lg$=0.75 for the full distributed reflector.)

It may be appreciated that the standard deviations of the slope efficiency histograms, and therefore the laser linearity, depend on the coupling strength, $\kappa*Lg$. The coupling strength may be adjusted by adjusting the coupling coefficient, $\kappa$, and/or adjusting the partial distributed reflector length, Lg. In some embodiments, the length, L, of the active regions of directly modulated DFB lasers may be between about 200 µm and about 500 µm. The partial distributed reflector length, Lg, for reducing nonlinear distortion in a directly modulated DFB laser, may be in the range of about 40% to about 90% of laser active region length, L. A relatively larger Lg may not improve distortion and a relatively shorter Lg may degrade the side mode suppression ratio (SMSR).

As illustrated in FIGS. 1A and 1B, the partial grating 140, 140' may be positioned at or near the first facet 110 or first region 110'. If a partial distributed reflector, e.g., partial distributed reflector 140, is positioned near an AR facet, e.g., first facet 110, ($L_1>0$), then to reduce distortion, the partial distributed reflector should also be positioned such that $L_1<L_2$. In other words, a partial distributed reflector should be positioned closer to an antireflection facet than a high reflection facet. If $L_1 \geq L_2$, then distortion may not be improved by a partial distributed reflector.

The coupling strength, $\kappa*Lg$, may be adjusted through selection of directly modulated DFB laser physical and/or material parameters. In general, to improve distortion, the coupling strength may be in the range of about 0.45 to about 1.0. In some embodiments, the coupling strength may be in the range of about 0.45 to about 0.8.

In an embodiment, a directly modulated DFB laser may be formed on an InP (Indium phosphide) substrate. An InGaAsP (Indium gallium arsenide phosphide) layer may first be grown on the InP substrate, followed by patterning a diffraction grating (i.e., distributed reflector) in the InGaAsP layer. In one embodiment, the diffraction grating may be patterned using lithographic techniques such that the diffraction grating extends over only a portion of the active region of the laser cavity and ends abruptly (i.e., without tapering). An InP layer may then be grown on the patterned InGaAsP layer. An active layer or layers may then be grown on the InP layer.

The coupling strength may be adjusted, for example, by adjusting the thickness of the InGaAsP layer. In another embodiment, the coupling strength may be adjusted by adjusting the distance between the diffraction grating and the active layer or layers (e.g., by adjusting the thickness of the InP layer.) In yet another embodiment, the coupling strength may be adjusted by adjusting the material composition of the InGaAsP layer (i.e., relative material concentrations). For example, relative concentrations of indium and phosphorus may be adjusted.

In one embodiment, the diffraction grating may include alternating stripes of InP and InGaAsP, beginning at a first facet, e.g. first facet 110 of FIG. 1A. Each stripe of InP may be about $w_1$ wide and each stripe of InGaAsP may be about $w_2$ wide. The alternating InP—InGaAsP stripes may have a defined period. For example, one period may include one width, $w_1$, of InP plus one width, $w_2$, of InGaAsP. The total width (i.e., $w_1+w_2$) may be one period. The fraction of the period that is InGaAsP (i.e., $w_2/(w_1+w_2)$) may be defined as the duty cycle. The coupling strength may be adjusted by adjusting the duty cycle. The duty cycle may also be adjusted to facilitate manufacturing. For example, a duty cycle of about 50% may facilitate manufacturability. However, other duty cycles may be appropriate, depending on the application.

In another embodiment, the diffraction grating may include a two-dimensional periodic array of points. This periodic array of points may be referred to as a photonic crystal. The points may be circular, rectangular or another shape. In this embodiment, the coupling strength may be adjusted by adjusting the size (e.g., diameter and/or surface area) of the points. In an embodiment, the points may be formed of InP on the patterned InGaAsP layer. In other embodiments, the points may be formed a material or compound material having a dielectric constant different from InP.

Although InP has been discussed, the use of other Group III-V compounds (e.g., GaAs) is contemplated and is considered to be within the scope of this disclosure. The particular material composition may depend, at least in part, on the application wavelength.

Figure 4:
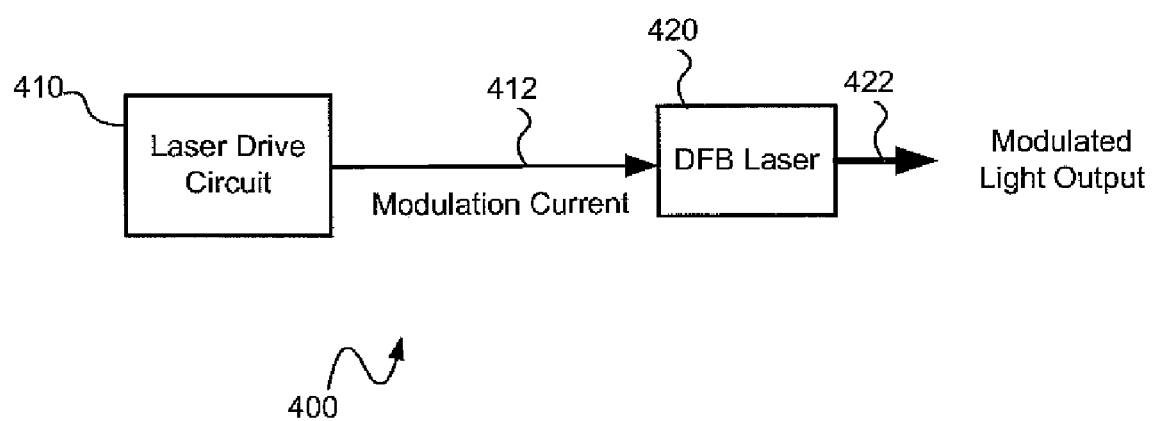
FIG. 4 is a schematic functional block diagram of a laser transmitter including a directly-modulated DFB laser, consistent with embodiments of the present disclosure.

Referring to FIG. 4, a laser transmitter 400 may include a laser drive circuit 410 coupled to a directly modulated DFB laser 420, such as the type described above. One example of the laser transmitter 400 is a laser transmitter designed for forward-path CATV applications, such as the type available from Applied Optoelectronics, Inc. In such "broadband" applications, the laser transmitter 400 and particularly the DFB laser 420 may be designed for high frequency operation, for example, up to about 1 GHz. This example of the laser transmitter 400 may also include other components, such as an RF amplifier, a thermoelectric cooler (TEC) controller, a microcontroller, a predistortion circuit, and/or a clipping correction circuit, as well as other components known to those skilled in the art for use in a laser transmitter. Embodiments of the directly-modulated DFB laser may also be used in other types of laser transmitters used in other communications applications or in other non-communications applications, such as chemical sensing.

The laser drive circuit 410 may include circuitry known to those skilled in the art for providing at least a modulation current 412 to the DFB laser 420. The laser drive circuit 410 may also provide other currents to the DFB laser 420 such as a laser threshold current and/or a bias current. The DFB laser 420 receives the modulation current 412 (and possible other currents) and generates a modulated light output 422 in response to the modulation current 412. Thus, the modulation of the light occurs within the cavity of the directly-modulated DFB laser 420. Nonlinearities that may occur within the laser cavity when directly modulating the DFB laser 420 may be reduced by using a DFB laser 420 that includes a distributed reflector extending asymmetrically along only a portion of the active region of the laser cavity and having the other characteristics described above.

Accordingly, embodiments of the directly-modulated DFB laser improve mode stability and improve optical field uniformity, for example, by reducing nonlinearities. Consistent with one embodiment, a directly modulated distributed feedback laser includes an active region having length, L, and bounded on opposing ends by a first external reflector and a second external reflector, and a distributed reflector having length, Lg, and a coupling strength, κ*Lg, adjacent the active region and between the external reflectors. The distributed reflector has a first end and a second end, wherein a first distance between the first end of the distributed reflector and the first external reflector is less than a second distance between the second end of the distributed reflector and the second external reflector.

Consistent with another embodiment, a laser transmitter includes a laser drive circuit configured to provide at least a modulation current and a directly modulated distributed feedback semiconductor laser configured to receive the modulation current and configured to generate a modulated light output in response to the modulation current. The directly modulated distributed feedback laser includes an active region having length, L, and bounded on opposing ends by a first external reflector and a second external reflector, and a distributed reflector having length, Lg, and a coupling strength, κ*Lg, adjacent the active region and between the external reflectors. The distributed reflector has a first end and a second end, wherein a first distance between the first end of the distributed reflector and the first external reflector is less than a second distance between the second end of the distributed reflector and the second external reflector.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A directly modulated distributed feedback laser, comprising:
   an active region having length, L, and bounded on opposing ends by a first external reflector and a second external reflector, wherein said first external reflector is a distributed Bragg reflector and said second external reflector is a distributed Bragg reflector; and
   a distributed reflector having length, Lg, and a coupling strength, κ* Lg, adjacent said active region and between said external reflectors, wherein said distributed reflector has a first end and a second end, wherein a first distance between said first end of said distributed reflector and said first external reflector is less than a second distance between said second end of said distributed reflector and said second external reflector.

2. The laser of claim 1 wherein said length, L, of said active region is between about 200 μm and about 500 μm.

3. The laser of claim 1 wherein a reflectance of said first external reflector is less than a reflectance of said second external reflector.

4. The laser of claim 1 wherein said first external reflector is coated with a low reflectance coating and said second external reflector is coated with a high reflectance coating.

5. The laser of claim 4 wherein said low reflectance coating has reflectivity less than about 5% and said high reflectance coating has reflectivity between about 25% and about 99%.

6. The laser of claim 1 wherein said length, Lg, of said distributed reflector, is between about 40% and about 90% of said length, L, of said active region.

7. The laser of claim 1 wherein said coupling strength is between about 0.45 and about 1.0.

8. The laser of claim 7 wherein said coupling strength is less than about 0.8.

9. A laser transmitter comprising:
   a laser drive circuit configured to provide at least a modulation current; and
   a directly modulated distributed feedback semiconductor laser configured to receive said modulation current and configured to generate a modulated light output in response to said modulation current,
   said directly modulated distributed feedback semiconductor laser comprising an active region having length, L, and bounded on opposing ends by a first external reflector and a second external reflector, wherein said first external reflector is a distributed Bragg reflector and said second external reflector is a distributed Bragg reflector, and a distributed reflector having length, Lg, and a coupling strength, κ* Lg, adjacent said active region and between said external reflectors, wherein said distributed reflector has a first end and a second end, wherein a first distance between said first end of said distributed reflector and said first external reflector is less than a second distance between said second end of said distributed reflector and said second external reflector.

10. The laser transmitter of claim 9 wherein said length, L, of said active region is between about 200 μm and about 500 μm.

11. The laser transmitter of claim 9 wherein a reflectance of said first external reflector is less than a reflectance of said second external reflector.

12. The laser transmitter of claim 9 wherein said first external reflector is coated with a low reflectance coating and said second external reflector is coated with a high reflectance coating.

13. The laser transmitter of claim 12 wherein said low reflectance coating has reflectivity less than about 5% and said high reflectance coating has reflectivity between about 25% and about 99%.

14. The laser transmitter of claim 9 wherein said length, Lg, of said distributed reflector, is between about 40% and about 90% of said length, L, of said active region.

15. The laser transmitter of claim 9 wherein said coupling strength is between about 0.45 and about 1.0.

16. The laser transmitter of claim 15 wherein said coupling strength is less than about 0.8.

17. The laser of claim 6 wherein said coupling strength is between about 0.45 and about 1.0.

18. The laser transmitter of claim 14 wherein said coupling strength is between about 0.45 and about 1.0.

* * * * *